United States Patent
Yamamoto et al.

(10) Patent No.: US 10,363,687 B2
(45) Date of Patent: Jul. 30, 2019

(54) MOLD AND METHOD FOR MANUFACTURING THE SAME

(71) Applicant: NALUX CO., LTD., Osaka-shi, Osaka (JP)

(72) Inventors: Kazuya Yamamoto, Osaka (JP); Takeshi Yamamoto, Osaka (JP)

(73) Assignee: NALUX CO., LTD., Osaka-shi, Osaka (JP)

( * ) Notice: Subject to any disclaimer, the term of this patent is extended or adjusted under 35 U.S.C. 154(b) by 0 days.

(21) Appl. No.: 15/881,936

(22) Filed: Jan. 29, 2018

(65) Prior Publication Data
US 2018/0154556 A1   Jun. 7, 2018

Related U.S. Application Data

(63) Continuation of application No. PCT/JP2015/075073, filed on Sep. 3, 2015.

(51) Int. Cl.
| | |
|---|---|
| *B29C 33/38* | (2006.01) |
| *B29C 33/42* | (2006.01) |
| *G02B 1/118* | (2015.01) |
| *C25D 1/10* | (2006.01) |
| *C25D 3/12* | (2006.01) |

(Continued)

(52) U.S. Cl.
CPC .......... *B29C 33/3842* (2013.01); *B29C 33/42* (2013.01); *B29C 33/424* (2013.01); *C25D 1/10* (2013.01); *C25D 3/12* (2013.01); *G02B 1/118* (2013.01); *G02B 5/0221* (2013.01); *G02B 5/0268* (2013.01); *G02B 5/0294* (2013.01);

(Continued)

(58) Field of Classification Search
None
See application file for complete search history.

(56) References Cited

U.S. PATENT DOCUMENTS

| | | |
|---|---|---|
| 2009/0194666 A1 | 8/2009 | Takamoto |
| 2015/0192702 A1 | 7/2015 | Yamamoto et al. |

FOREIGN PATENT DOCUMENTS

| | | |
|---|---|---|
| JP | 2006-068926 A | 3/2006 |
| JP | 2010-272801 A | 12/2010 |

(Continued)

OTHER PUBLICATIONS

H. Jansen et al., Journal of Micromech. and Microeng. vol. 6, pp. 14-28. (Year: 1996).*

(Continued)

*Primary Examiner* — Jiong-Ping Lu
(74) *Attorney, Agent, or Firm* — Squire Patton Boggs (US) LLP

(57) ABSTRACT

A method for manufacturing a mold according to the first aspect of the present invention includes the steps of: placing a base material of semiconductor or metal that reacts with sulfur hexafluoride in a reactive ion etching apparatus; supplying a mixed gas of sulfur hexafluoride and oxygen thereto; making the base material undergo a plasma dry-etching process such that oxides are scattered on a surface of the base material, etching advances on the surface of the base material while the oxides function as etching masks, and thereby a fine surface roughness is formed on the surface of the base material; and irradiating the fine surface roughness with an ion beam such that shapes of protrusions of the fine surface roughness can be adjusted.

6 Claims, 16 Drawing Sheets

(51) Int. Cl.
*G02B 5/02* (2006.01)
*H01J 37/32* (2006.01)

(52) U.S. Cl.
CPC ..... *B29K 2905/08* (2013.01); *H01J 37/32412* (2013.01); *H01J 2237/334* (2013.01)

(56) References Cited

FOREIGN PATENT DOCUMENTS

| JP | 2013-077617 A | 4/2013 | | |
|---|---|---|---|---|
| WO | WO 2007/020967 A1 | 2/2007 | | |
| WO | WO 2014/076983 A1 | 5/2014 | | |
| WO | WO2014076983 | * | 5/2014 | ............. B29C 33/38 |

OTHER PUBLICATIONS

T.G. Harvey, SPIE vol. 3099, pp. 76-82. (Year: 1997).*
International Search Report & Written Opinion dated Oct. 20, 2015 corresponding to International Patent Application No. PCT/JP2015/075073, and English translation thereof.

* cited by examiner

MOLD AND METHOD FOR MANUFACTURING THE SAME

CROSS REFERENCE TO RELATED APPLICATION

This is a Continuation of International Patent Application No. PCT/JP2015/075073 filed Sep. 3, 2015. The contents of this application is hereby incorporated by reference.

BACKGROUND

Technical Field

The present invention relates to a mold provided with a fine surface roughness thereon, a method for manufacturing the mold and a method for manufacturing a molded product using the mold.

Background Art

Anti-reflective structures having a fine surface roughness, the pitch (or the period) of the fine surface roughness being smaller than the wavelength of light, are used in optical elements. As a method for manufacturing molds for such anti-reflective structures, methods in which a resist undergoes patterning using an interference exposure apparatus or an electron-beam lithography system and then etching or electroforming is carried out are known. However, it is difficult to form a fine surface roughness on a large area of a flat surface or a curved surface by these methods.

Under the above-described situation, the inventors of the present application have developed a method for manufacturing a mold provided with a fine surface roughness thereon by a reactive ion-etching process without the necessity of patterning (Patent document 1). According to the method, a fine surface roughness can be formed on a large area of a flat surface or a curved surface without carrying out patterning.

However, when, for example, a fine surface roughness having a pitch of 0.26 micrometers or less that corresponds to the wavelength equal to less than the minimum wavelength of visible lights is formed, it has been difficult to adjust the shape of the fine surface roughness to a sufficient extent by a reactive ion-etching process alone.

Under the above-described situation, there is a need for a method for manufacturing a mold provided with a fine surface roughness thereon, by which the shape of a fine surface roughness having a pitch in a wide range including a range that is equal to or less than the wavelength of visible light can be adjusted to a sufficient extent and a mold that is manufactured by the method and provided with a fine surface roughness having a shape that has been adjusted to a sufficient extent.

PRIOR ART DOCUMENT

Patent Document

Patent document 1: WO2014/076983A1

Accordingly, the object of the present application is to provide a method for manufacturing a mold provided with a fine surface roughness thereon, by which the shape of a fine surface roughness having a pitch in a wide range including a range that is equal to or less than wavelengths of visible lights can be adjusted to a sufficient extent and mold that is manufactured by the method and provided with a fine surface roughness having a shape that has been adjusted to a sufficient extent.

SUMMARY OF INVENTION

A method for manufacturing a mold according to the first aspect of the present invention includes the steps of: placing a base material of semiconductor or metal that reacts with sulfur hexafluoride in a reactive ion etching apparatus; supplying a mixed gas of sulfur hexafluoride and oxygen thereto; making the base material undergo a plasma dry-etching process such that oxides are scattered on a surface of the base material, etching advances on the surface of the base material while the oxides function as etching masks, and thereby a fine surface roughness is formed on the surface of the base material; and irradiating the fine surface roughness with an ion beam such that shapes of protrusions of the fine surface roughness can be adjusted.

The method for manufacturing a mold according to the present aspect includes the step of irradiating the fine surface roughness with an ion beam such that shapes of protrusions of the fine surface roughness can be adjusted in addition to the step in which the fine surface roughness is formed in the reactive ion etching apparatus. Accordingly, the shapes of protrusions of the fine surface roughness can be made as desired. As a result, anti-reflective feature of fine surface roughness can be improved.

A method for manufacturing a mold according to the first embodiment of the first aspect of the present invention further includes the step of reproducing the fine surface roughness by electromolding.

The present embodiment enlarges the field of application of the invention.

In a method for manufacturing a mold according to the second embodiment of the first aspect of the present invention, an angle of the ion beam relative to an axis perpendicular to a surface on which the base material is fixed is in a range from 0 degree to 20 degrees.

According to the present embodiment, it is easy to form protrusions of the fine surface roughness into a spindle-shape that is convenient for improving anti-reflective feature, for example.

In a method for manufacturing a mold according to the third embodiment of the first aspect of the present invention, wherein the base material is formed as a plate substrate or a film substrate.

In a method for manufacturing a mold according to the fourth embodiment of the first aspect of the present invention, a mixed gas of carbon tetrafluoride or trifluoromethane and oxygen is used in place of the mixed gas of sulfur hexafluoride and oxygen.

A mold according to the second aspect of the present invention is a mold that has been manufactured according to any of the methods according to the first aspect.

Since the mold according to the present aspect has been manufactured according to any of the methods according to the first aspect, protrusions of the fine surface roughness is formed into a desired shape such as a spindle-shape, for example.

A mold according to the first embodiment of the second aspect of the present invention is used for an optical element.

A mold according to the second embodiment of the second aspect of the present invention is used for an anti-reflective structure.

A mold according to the second embodiment of the third aspect of the present invention is used for an anti-reflective structure used in a visible light range.

A method for manufacturing molded products according to the third aspect of the present invention includes the steps of: manufacturing a mold according to any of the methods according to the first aspect; and manufacturing molded products through molding with the mold.

According to the present aspect, protrusions of the fine surface roughness of the mold is formed into a desired shape, and therefore molded products that have a desired performance can be obtained.

DESCRIPTION OF EMBODIMENTS

Figure 1:
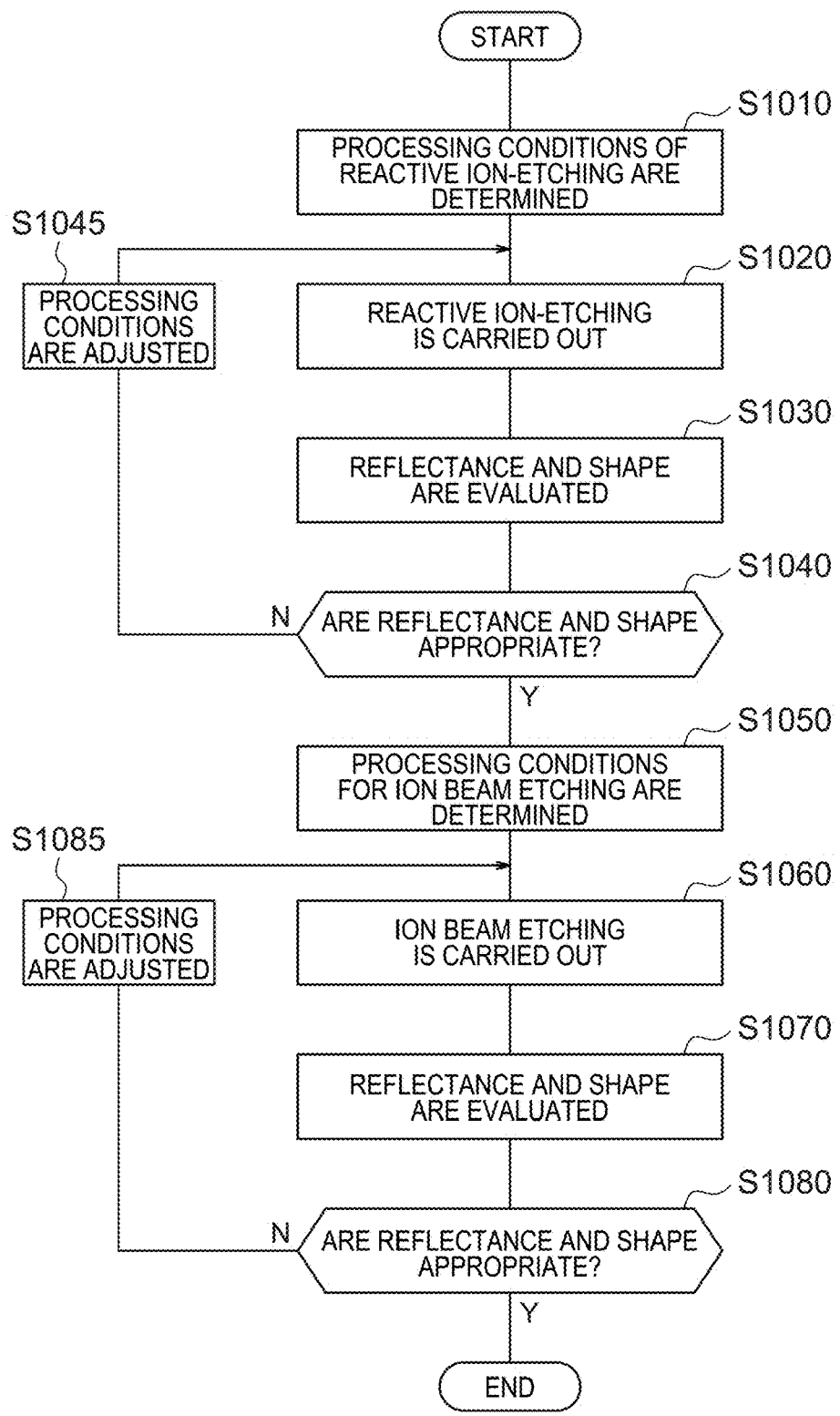
FIG. 1 is a flowchart showing a method for manufacturing a mold according to an embodiment of the present invention.

FIG. 1 is a flowchart showing a method for manufacturing a mold according to an embodiment of the present invention. In the present method, at first a fine surface roughness is formed on a surface of a base material by reactive ion-etching, and then the fine surface roughness formed in the way described above is processed by ion beam etching. The flowchart of FIG. 1 illustrates a method by which a mold for an anti-reflective structure is manufactured.

In step S1010 of FIG. 1, processing conditions of reactive ion-etching are determined. The processing conditions of reactive ion-etching will be described in detail later.

In step S1020 of FIG. 1, the base material is made to undergo reactive ion-etching.

Figure 2:
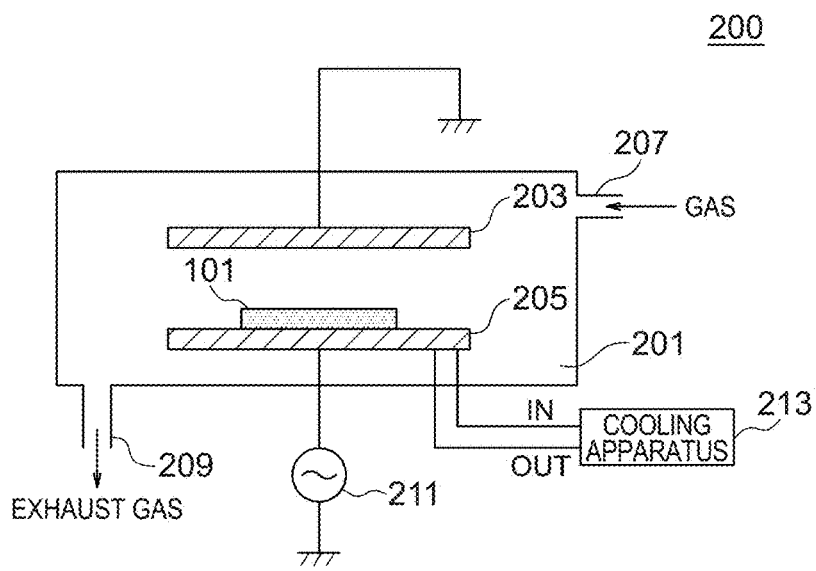
FIG. 2 is a diagram showing constitution components in a reactive ion etching apparatus used for manufacturing a mold provided with a fine surface roughness.

FIG. 2 is a diagram showing constitution components in a reactive ion etching apparatus 200 used for manufacturing a mold provided with a fine surface roughness. The reactive ion etching apparatus 200 has an enclosure 201. The enclosure 201 is evacuated and then supplied with gasses through a gas supply port 207. Further, the enclosure 201 is provided with a gas exhaust port 209 that is provided with a valve not shown in the drawing. By manipulating the valve, the gas pressure in the enclosure 201 is maintained at a desired value. The enclosure 201 is provided with an upper electrode 203 and a lower electrode 205. By applying a high frequency voltage between the both electrodes by a high frequency power supply unit 211, plasma can be generated there. On the lower electrode 205, a substrate 101 of a base material is placed. The lower electrode 205 can be cooled by a cooling apparatus 213 to a desired temperature. The cooling apparatus 213 is that using a water-cooling type chiller for cooling, for example. The purpose of cooling the lower electrode 205 is to control etching reaction by maintaining the temperature of the substrate 101 at a desired value.

The reactive ion etching apparatus that is illustrated with FIG. 2 is of a capacitively-coupled type. Another type of ion etching apparatus, for example, an inductively-coupled type of ion etching apparatus may be used.

The gas supplied to the enclosure 201 is a mixed gas of sulfur hexafluoride gas and oxygen gas. Further, the base material is a semiconductor or a metal that reacts with sulfur hexafluoride.

Figure 3:
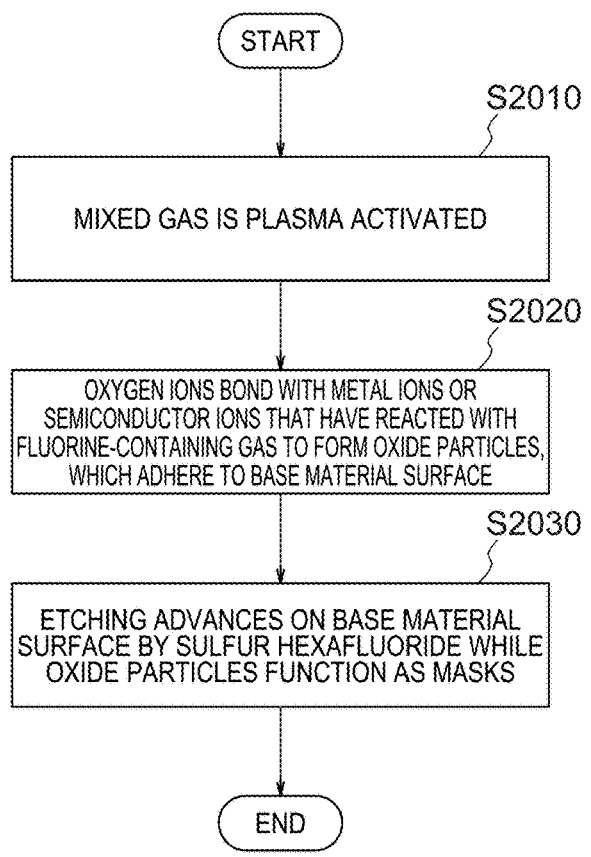
FIG. 3 is a flowchart for illustrating how the fine surface roughness is formed by reactive ion etching in the reactive ion etching apparatus.

FIG. 3 is a flowchart for illustrating how the fine surface roughness is formed by reactive ion etching in the reactive ion etching apparatus 200.

In step S2010 of FIG. 3, by applying a high frequency voltage such that plasma dry etching is carried out the mixed gas is plasma activated.

In step S2020 of FIG. 3, oxygen ions in the plasma bond with metal ions or semiconductor ions of the base material that have reacted with the fluorine-containing gas (sulfur hexafluoride gas) to form oxide particles, which adhere to the base material surface at random positions. The oxide particles are hardly etched by sulfur hexafluoride, and therefore function as etching masks.

In step S2030 of FIG. 3, etching advances on portions on the base material surface that are not covered with the oxide particles by sulfur hexafluoride while the oxide particles function as etching masks. As a result, a fine surface roughness is formed on the base material surface.

The used gas is a mixed gas of sulfur hexafluoride ($SF_6$) gas and oxygen gas as described above.

The base material is a semiconductor or a metal that reacts with sulfur hexafluoride. More specifically, the base material is silicon, titanium, tungsten, tantalum, a titanium alloy made by adding other elements to titanium, a tungsten alloy made by adding other elements to tungsten or the like.

FIGS. 4A to 4D illustrate a method for manufacturing a mold provided with a fine surface roughness on its flat surface.

Figure 4A:
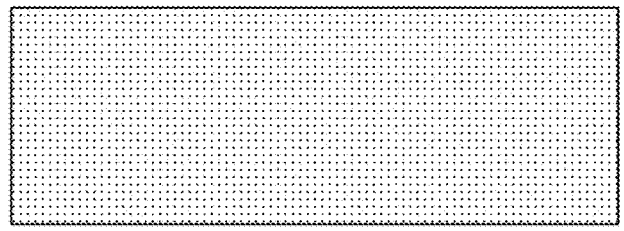
FIGS. 4A to 4D illustrate a method for manufacturing a mold provided with a fine surface roughness on its flat surface.

FIG. 4A shows a cross section of a base material that has not yet undergone etching. The base material is silicon, for example.

Figure 4B:
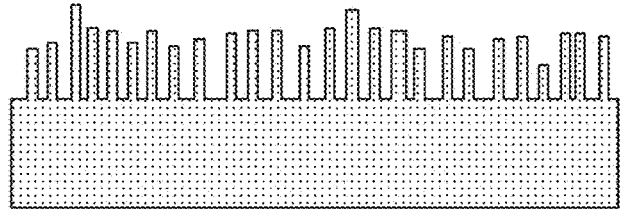
Figure 4C:
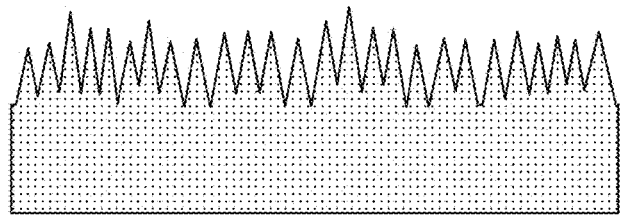
Figure 4D:
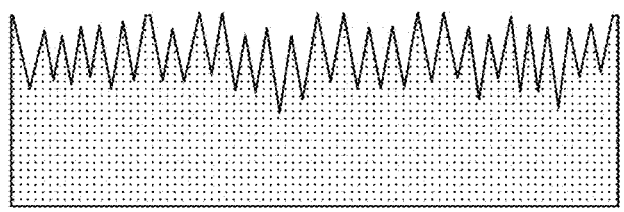

FIG. 4B shows a cross section of the base material on which a fine surface roughness has been formed by the reactive ion etching apparatus. In FIGS. 4B to 4D, dimensions of the fine surface roughness are enlarged with respect to dimensions of the base material for easier understanding.

Descriptions of FIG. 4C and FIG. 4D will be given later.

FIGS. 5A to 5D illustrate a method for manufacturing a mold provided with a fine surface roughness on its curved surface.

Figure 5A:
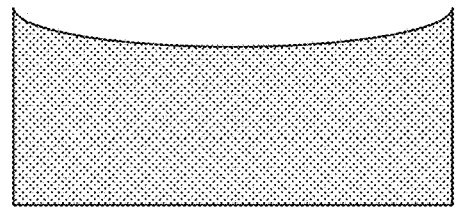
FIGS. 5A to 5D illustrate a method for manufacturing a mold provided with a fine surface roughness on its curved surface.

FIG. 5A shows a core of a mold on which a curved surface is formed. The material of the core is stainless steel, for example.

Figure 5B:
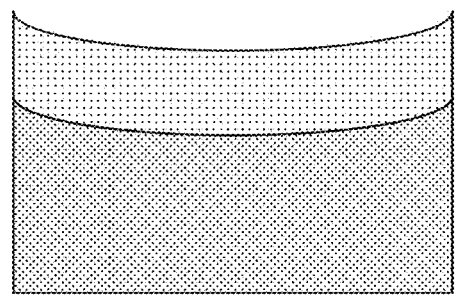

FIG. 5B shows the core and a film made of a base material that is formed on the curved surface of the core. The base material is silicon, for example.

Figure 5C:
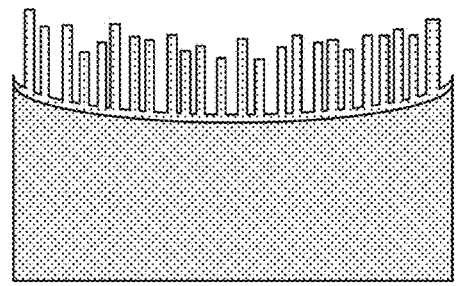
Figure 5D:
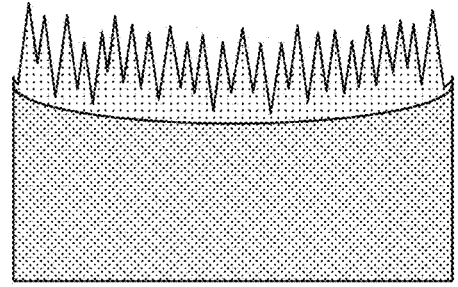

FIG. 5C shows a cross section of the core and the film on which a surface roughness has been formed using the reactive ion etching apparatus. In FIGS. 5C to 5D, dimensions of the fine surface roughness are enlarged with respect to dimensions of the film for easier understanding.

Descriptions of FIG. 5D will be given later.

In step S1030 of FIG. 1, reflectance of the object provided with the fine surface roughness and the shape of the fine surface roughness are evaluated. For the evaluation, a scanning electron microscope is used, for example.

In step S1040 of FIG. 1, it is determined whether the reflectance and the shape are appropriate. If it is determined that they are appropriate, the process goes to step S1050. If it is determined that they are not appropriate, the process goes to step S1045.

In step S1045 of FIG. 1, the processing conditions for reactive ion etching are adjusted.

In step S1050 of FIG. 1, processing conditions for ion beam etching are determined. The processing conditions for ion beam etching will be described in detail later.

In step S1060 of FIG. 1, the object provided with the fine surface roughness is made to undergo ion beam etching.

Figure 6:
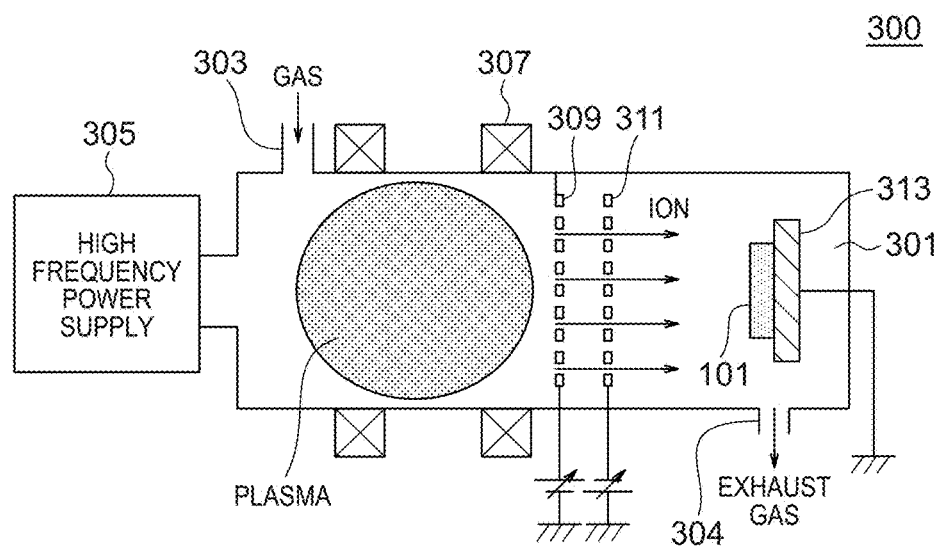
FIG. 6 is a diagram showing components in an ion beam etching apparatus used for manufacturing a mold provided with a fine surface roughness.

FIG. 6 is a diagram showing constitution components in an ion beam etching apparatus 300 used for manufacturing a mold provided with a fine surface roughness. The ion beam etching apparatus 300 has an enclosure 301. The enclosure 301 is evacuated and then supplied with gasses through a gas supply port 303. Further, the enclosure 301 is provided with a gas exhaust port 304 that is provided with a valve not shown in the drawing. By manipulating the valve, the gas pressure in the enclosure 301 is maintained at a desired value. By supplying power to the gases in the enclosure 301 using a high frequency power supply unit 305 of 2.45 Giga-Herz (GHz), plasma is generated. Flow rates of gases, pressures of gases and the high frequency power are adjusted to obtain a desired value of ion density of the plasma. Magnet coils 307 are provided such that they partially cover the outside of the enclosure 301. Using the magnet coils 307, magnetic field is generated so as to control distribution of the plasma and to adjust the ion density and the ion distribution (the uniformity). An acceleration electrode plate 309 is maintained at a positive potential and functions to make ions in the plasma move toward an object 101 to be processed that is fixed to a stage 313. An extractor electrode plate 311 is maintained at a negative potential and functions to prevent electrons from flowing into the plasma. Thus, an ion beam is directed toward the object 101 to be processed that is fixed to the stage 313.

Figure 7A:
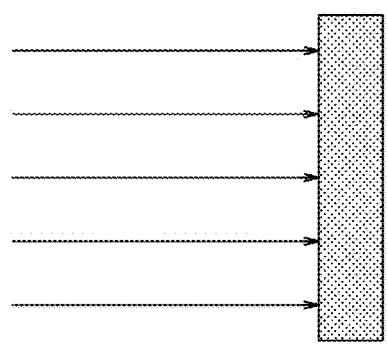
FIG. 7A shows the state in which the direction of the axis agrees with the direction of the ion beam, that is, the angle θ is zero.
Figure 7B:
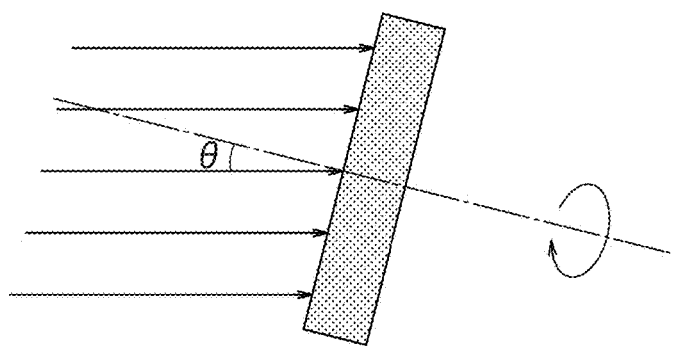
FIG. 7B shows the state in which the direction of the axis is tilted at a nonzero angle θ relative to the direction of the ion beam.

FIGS. 7A and 7B illustrate how the stage 313 on which the object 101 to be processed is fixed operates. The stage 313 is configured such that it can rotate around an axis perpendicular to a surface on which the object 101 to be processed is fixed. Further, the axis is configured such that it can be tilted at a variable angle $\theta$ relative to the direction of the ion beam.

FIG. 7A shows the state in which the orientation of the axis agrees with the direction of the ion beam, that is, the angle $\theta$ is zero.

FIG. 7B shows the state in which the orientation of the axis is tilted at a nonzero angle $\theta$ relative to the direction of the ion beam.

Figure 8A:
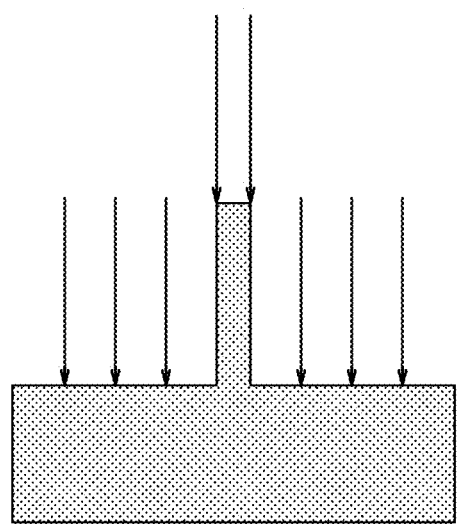
FIGS. 8A and 8B illustrate how the ion beam acts on a protrusion of the fine surface roughness when the longitudinal direction of the protrusion of the fine surface roughness agrees with the direction of the ion beam.
Figure 8B:
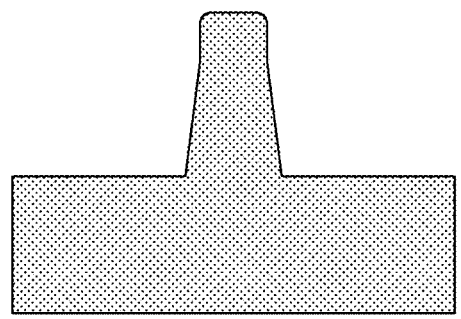

FIGS. 8A and 8B illustrate how the ion beam acts on a protrusion of the fine surface roughness when the longitudinal direction of the protrusion of the fine surface roughness agrees with the direction of the ion beam. In the reactive ion etching process described in step S1020 of FIG. 1, the protrusions of the fine surface roughness are formed such that they extend substantially perpendicular to a surface of a plate substrate or of a film. The case shown in FIG. 8A corresponds to the state of FIG. 7A in which the orientation of the axis of the stage agrees with the direction of the ion beam.

FIG. 8A shows the shape of a protrusion of the fine surface roughness that is observed when the ion beam processing is started, and FIG. 8B shows the shape of the protrusion of the fine surface roughness that is observed after the ion beam processing has been finished. Ions that collide against the surface of the plate substrate or of the film generate spatters so that particles of the base material adhere to the side of the protrusion. Accordingly, with an amount of time over which the protrusion of the fine surface roughness undergoes the ion beam, the diameter of the protrusion increases. Further, the lower portion of the protrusion receives greater number of particles than the upper portion, and therefore the diameter of the lower portion becomes greater than the diameter of the upper portion. In the ion beam etching process, the etching rate of protrusions of the fine surface roughness is greater than the etching rate of recessed portions, and therefore the depth of the fine surface roughness becomes slightly smaller through the ion beam etching process.

Figure 9A:
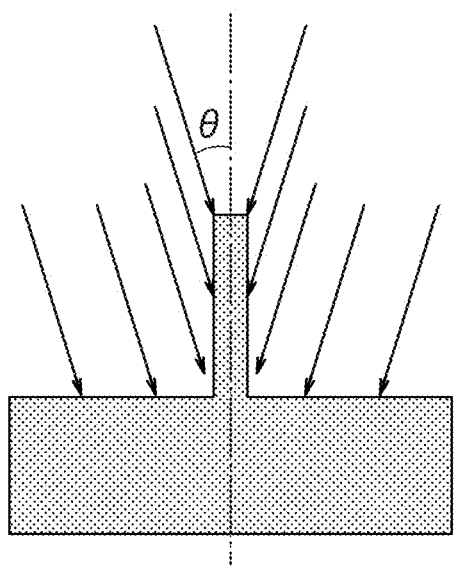
FIGS. 9A and 9B illustrate how the ion beam acts on a protrusion of the fine surface roughness when the direction of the ion beam is tilted at an angle θ relative to the longitudinal direction of the protrusion of the fine surface roughness.
Figure 9B:
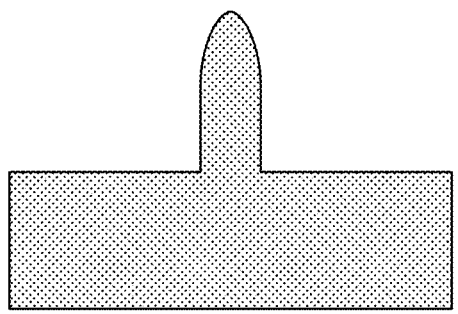

FIGS. 9A and 9B illustrate how the ion beam acts on a protrusion of the fine surface roughness when the direction of the ion beam is tilted at an angle $\theta$ relative to the longitudinal direction of the protrusion of the fine surface roughness. The case shown in FIG. 9A corresponds to the state of FIG. 7B in which the orientation of the axis of the stage is tilted at the angle θ relative to the direction of the ion beam.

FIG. 9A shows the shape of a protrusion of the fine surface roughness that is observed when the ion beam processing is started, and FIG. 9B shows the shape of the protrusion of the fine surface roughness that is observed after the ion beam processing has been finished. Since the direction of the ion beam is tilted at an angle θ relative to the longitudinal direction of the protrusion of the fine surface roughness, the tip of the protrusion is eroded by the ion beam so that the tip is spindle-shaped or sharp-pointed. As with the case shown in FIGS. 8A and 8B, ions that collide against the surface of the plate substrate or of the film generate spatters. However, an amount of particles of the base material that adhere to the side of the protrusion is smaller than that in the case shown in FIGS. 8A and 8B, because the direction of the ion beam is tilted at the angle θ relative to the longitudinal direction of the protrusion of the fine surface roughness. Accordingly, an increase in the diameter of the protrusion is smaller than that in the case shown in FIGS. 8A and 8B.

By changing the amount of time of ion beam irradiation and the angle θ of an ion beam as processing conditions of ion beam etching, shapes of the protrusions of the fine surface roughness can be changed. The shapes of the protrusions of the fine surface roughness have an influence on the reflectance, and therefore the shapes of the protrusions of the fine surface roughness can be changed so as to reduce the reflectance by irradiating the fine surface roughness with an ion beam under processing conditions of ion beam etching that are appropriately selected.

The ion beam etching apparatus described with the help of FIG. 6 is that of electron cyclotron resonance (ECR) type. Alternatively, in an ion beam etching apparatus of capacitively-coupled type or that of inductively-coupled type, an ion beam can be generated using an inactive gas such as argon.

FIG. 4C shows a cross section of the fine surface roughness in which shapes of the protrusions have been changed by irradiating with an ion beam the fine surface roughness shown in FIG. 4B.

FIG. 4D shows a cross section of a fine surface roughness that has been reproduced by electroforming from the fine surface roughness shown in FIG. 4C.

The fine surface roughness shown in FIG. 4C can be used as a mold. Alternatively, the fine surface roughness shown in FIG. 4D can be used as a mold.

FIG. 5D shows a cross section of the fine surface roughness in which shapes of the protrusions have been changed by irradiating with an ion beam the fine surface roughness formed on the film. The fine surface roughness shown in FIG. 5D is used as a mold.

In step S1070 of FIG. 1, the reflectance of the object provided with the fine surface roughness and the shape of the fine surface roughness are evaluated. For the evaluation, a scanning electron microscope is used, for example.

In step S1080 of FIG. 1, it is determined whether the reflectance and the shape are appropriate. If it is determined that they are appropriate, the process is finished. If it is determined that they are not appropriate, the process goes to step S1085.

In step S1085 of FIG. 1, the processing conditions for ion beam etching are adjusted.

In the manufacturing method shown in FIG. 1, the pitch and the depth of the fine surface roughness are substantially determined by the processing conditions of reactive ion-etching in step S1020 as described later.

The pitch of a fine surface roughness is defined as an average of distances in the direction parallel to the surface of the base material between adjacent protrusions or adjacent recessed portions in a cross section of the fine surface roughness observed by an atomic force microscope or the like. The pitch may be obtained by the use of Fourier analysis of the cross section of the fine surface roughness.

The depth of a fine surface roughness is defined as an average of distances in the direction vertical to the surface of the base material between a protrusion and a recessed portion that are adjacent to each other in a cross section of the fine surface roughness observed by an atomic force microscope or the like.

Further, shapes of the protrusions of the fine surface roughness is substantially determined by the processing conditions of ion beam etching in step S1060 as described above.

How to change the pitch and the depth of a fine surface roughness in reactive etching process will be described below.

Table 1 shows an example of processing conditions for reactive etching process that include gas pressure (working pressure) in the enclosure 201 of the reactive ion etching apparatus 200, amounts of sulfur hexafluoride ($SF_6$) supply and oxygen ($O_2$) supply (a mixing ratio of $SF_6$ and $O_2$), power of the high frequency power supply unit 211 (RF power) and a cooling temperature of the substrate 101. The frequency of the high frequency power supply unit 211 is 13.56 MHz. The material of the substrate 101 is silicon.

TABLE 1

| Gas pressure | Gas flow rate | RF power | Cooling temperature |
|---|---|---|---|
| 3 Pa | SF6: 40 mL/min<br>O2: 50 mL/min | 100 W | 2° C. |

Figure 10:
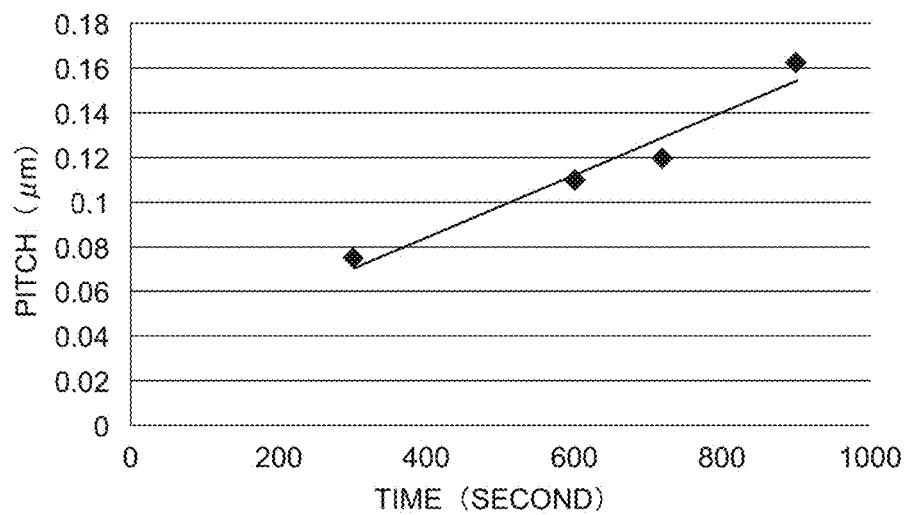
FIG. 10 shows a relationship between the processing time of reactive ion etching and the pitch of the fine surface roughness under the conditions shown in Table 1.

FIG. 10 shows a relationship between processing time of reactive ion etching and pitch of the fine surface roughness under the conditions shown in Table 1. The horizontal axis of FIG. 10 indicates processing time of reactive ion etching, and the vertical axis of FIG. 10 indicates pitch of the fine surface roughness. The unit of time is second, and the unit of pitch is micrometer.

Figure 11:
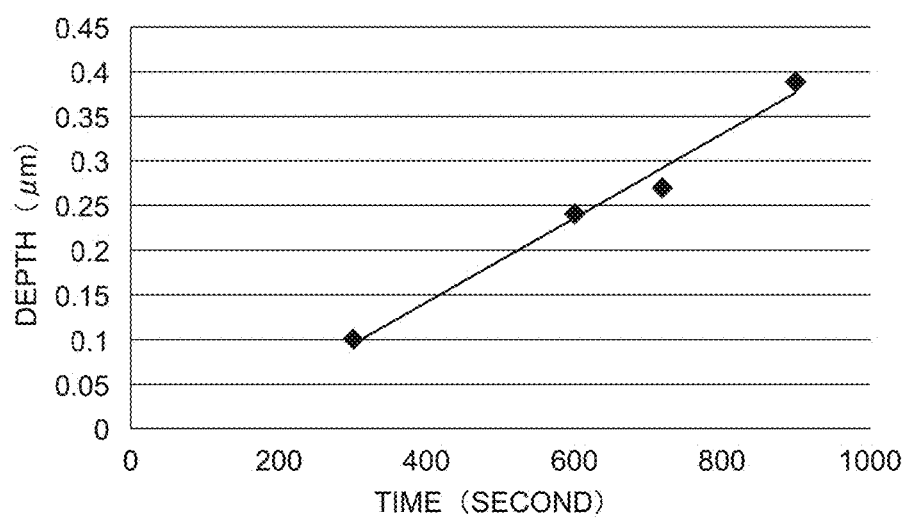
FIG. 11 shows a relationship between the processing time of reactive ion etching and the depth of the fine surface roughness under the conditions shown in Table 1.

FIG. 11 shows a relationship between processing time of reactive ion etching and depth of the fine surface roughness under the conditions shown in Table 1. The horizontal axis of FIG. 11 indicates processing time of reactive ion etching, and the vertical axis of FIG. 11 indicates depth of the fine surface roughness. The unit of time is second, and the unit of depth is micrometer.

According to FIG. 10 and FIG. 11, pitch and depth of the fine surface roughness increase with processing time of reactive ion etching.

Table 2 shows another example of processing conditions for reactive etching process that include gas pressure (working pressure) in the enclosure 201 of the reactive ion etching apparatus 200, amounts of sulfur hexafluoride ($SF_6$) supply and oxygen ($O_2$) supply (a mixing ratio of $SF_6$ and $O_2$), and a cooling temperature of the substrate 101. The material of the substrate 101 is silicon.

TABLE 2

| Gas pressure | Mixing ratio of $SF_6$ and $O_2$ | Cooling temperature |
|---|---|---|
| 1 Pa | 50 mL/min:50 mL/min | 3° C. |

Figure 12:
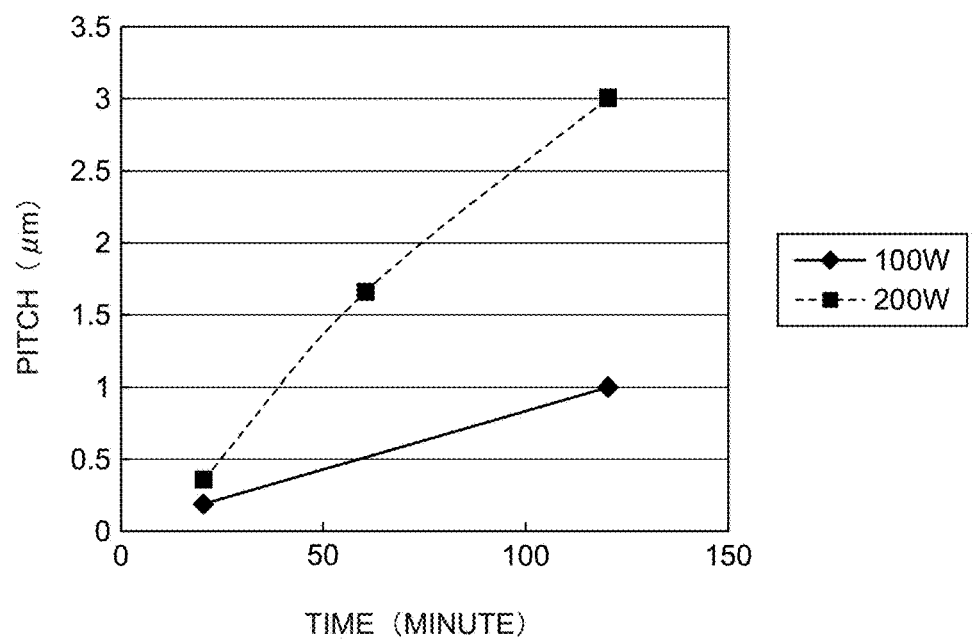
FIG. 12 shows relationships between the processing time of reactive ion etching and the pitch of the fine surface roughness when the conditions shown in Table 2 are maintained, and the power of the high frequency power supply unit is set respectively at 100 watts and 200 watts

FIG. 12 shows relationships between processing time of reactive ion etching and pitch of the fine surface roughness when the conditions shown in Table 2 are maintained, and power of the high frequency power supply unit 211 is set respectively at 100 watts and 200 watts. The horizontal axis of FIG. 12 indicates processing time of reactive ion etching, and the vertical axis of FIG. 12 indicates pitch of the fine surface roughness. The unit of time is second, and the unit of pitch is micrometer.

Figure 13:
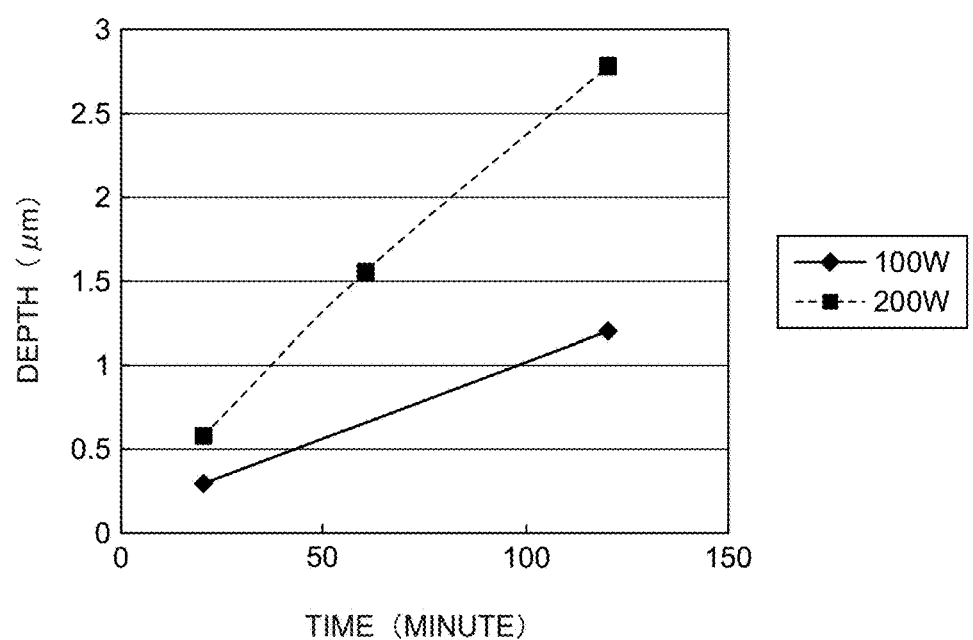
FIG. 13 shows relationships between the processing time of reactive ion etching and the depth of the fine surface roughness when the conditions shown in Table 2 are maintained, and the power of the high frequency power supply unit is set respectively at 100 watts and 200 watts.

FIG. 13 shows relationships between processing time of reactive ion etching and depth of the fine surface roughness when the conditions shown in Table 2 are maintained, and power of the high frequency power supply unit 211 is set respectively at 100 watts and 200 watts. The horizontal axis of FIG. 13 indicates processing time of reactive ion etching, and the vertical axis of FIG. 13 indicates depth of the fine surface roughness. The unit of time is second, and the unit of depth is micrometer.

According to FIG. 12 and FIG. 13, pitch and depth of the fine surface roughness increase with processing time of reactive ion etching as well as with power of the high frequency power supply unit 211.

According to FIGS. 10 to 13, any fine surface roughness having a pitch in the range from 0.08 micrometers to 3 micrometers and a depth in the range from 0.1 micrometers to 2.8 micrometers can be manufactured by appropriately determining processing time of reactive ion etching and power of the high frequency power supply unit 211.

Table 3 shows another example of processing conditions for reactive etching process that include gas pressure (working pressure) in the enclosure 201 of the reactive ion etching apparatus 200, amounts of sulfur hexafluoride ($SF_6$) supply and oxygen ($O_2$) supply (a mixing ratio of $SF_6$ and $O_2$), power of the high frequency power supply unit 211 (RF power) and a cooling temperature of the substrate 101. The material of the substrate 101 is silicon.

TABLE 3

| Gas pressure | Mixing ratio of $SF_6$ and $O_2$ | RF power | Time | Cooling temperature |
|---|---|---|---|---|
| 1 Pa | 50 mL/min:40 mL/min | 300 W | 120 min | 3° C. |

The pitch and the depth of the fine surface roughness obtained by the processing conditions given in Table 3 are 18.0 micrometers and 6.0 micrometers, respectively.

FIGS. 14A to 14D are photos showing shapes of the fine surface roughness obtained by ion beam etching using ion beams at different angles. Angle θ of an ion beam is that described using FIGS. 7A and 7B. The processing time of ion beam etching is 10 minutes.

Figure 14A:
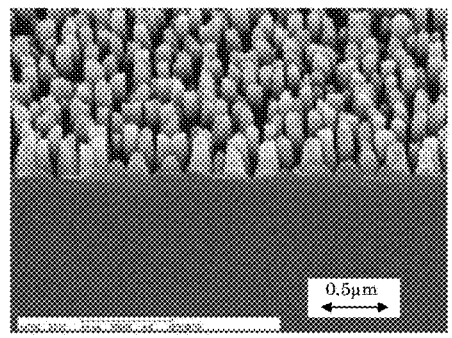
FIGS. 14A to 14D are photos showing shapes of the fine surface roughness obtained by ion beam etching using ion beams at different angles.

FIG. 14A is a scanning electron microscope (SEM) photo in the case that the angle θ is 0 degree.

Figure 14B:
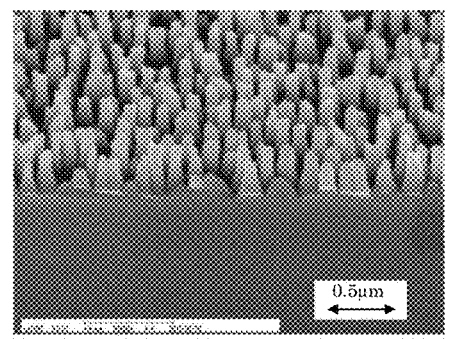

FIG. 14B is an SEM photo in the case that the angle θ is 10 degrees.

Figure 14C:
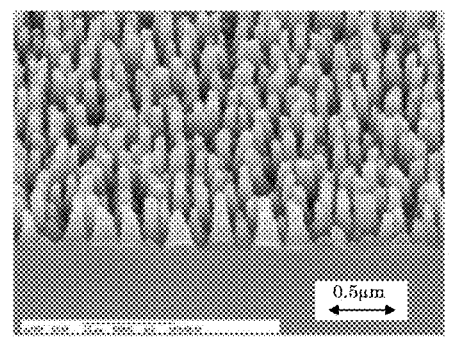

FIG. 14C is an SEM photo in the case that the angle θ is 15 degrees.

Figure 14D:
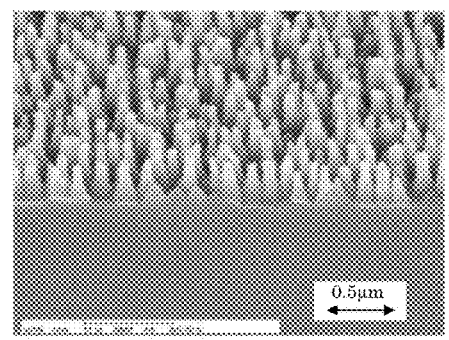

FIG. 14D is an SEM photo in the case that the angle θ is 20 degrees. The cases that angle θ ranges from 0 degree to 20 degrees are described above. Values of the angle θ up to 45 degrees may be employed according to a desired shape.

Figure 15A:
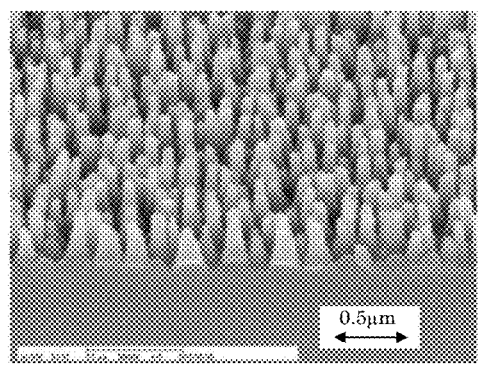
FIGS. 15A and 15B are SEM photos showing shapes of the fine surface roughness obtained by ion beam etching with an ion beam at the angle θ of 15 degrees and with different values of processing time.
Figure 15B:
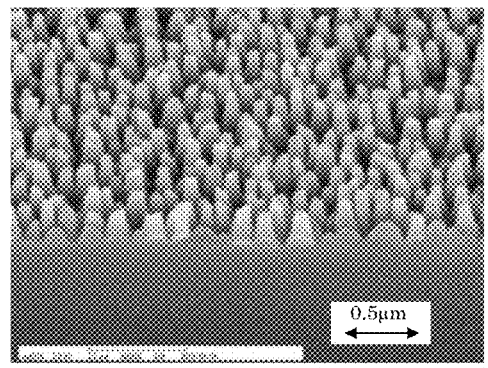

FIGS. 15A and 15B are SEM photos showing shapes of the fine surface roughness obtained by ion beam etching with an ion beam at the angle θ of 15 degrees and with different values of processing time.

FIG. 15A is an SEM photo in the case that the processing time is 10 minutes.

FIG. 15B is an SEM photo in the case that the processing time is 15 minutes.

Table 4 shows processing conditions for reactive etching processes for the shapes of the fine surface roughness shown in FIGS. 14A to 14D and FIGS. 15A and 15B.

TABLE 4

| Gas pressure | Gas flow rate | RF power | Cooling temperature | Time |
|---|---|---|---|---|
| 3 Pa | SF6: 40 mL/min O2: 50 mL/min | 100 W | 2° C. | 720 sec |

Table 5 shows processing conditions for ion beam etching processes by which the shapes of the fine surface roughness shown in FIGS. 14A to 14D and FIGS. 15A and 15B are formed. The frequency of the high frequency power supply unit 305 is 2.45 Giga-Herz (GHz).

TABLE 5

| Gas pressure | Gas flow rate | Potential of acceleration electrode plate | Potential of extractor electrode plate | Power of microwave |
|---|---|---|---|---|
| $8.7 \times 10^{-3}$ Pa | Ar: 3.0 mL/min | +500 V | −225 V | 100 W |

After the values of reflectance and the shapes of the fine surface roughness shown in FIGS. 14A to 14D and FIGS. 15A and 15B have been evaluated, the processing time of ion beam etching is set at 10 minutes and the angle θ of an ion beam is set at 15 degrees.

Table 6 shows the processing conditions for ion beam etching that are determined as described above.

TABLE 6

| Gas pressure | Gas flow rate | Potential of acceleration electrode plate | Potential of extractor electrode plate | Power of microwave | Etching angle | Time |
|---|---|---|---|---|---|---|
| $8.7 \times 10^{-3}$ Pa | Ar: 3.0 mL/min | +500 V | −225 V | 100 W | 15° | 10 min |

Figure 16A:
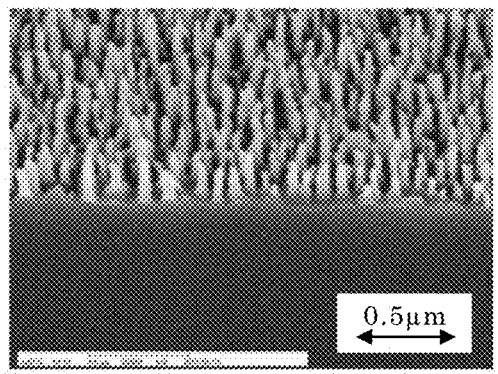
FIGS. 16A and 16B are SEM photos of shapes of the fine surface roughness.
Figure 16B:
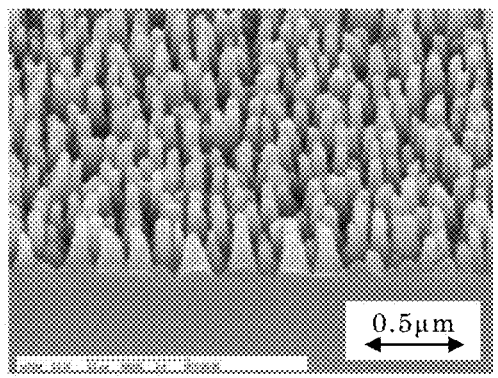

FIGS. 16A and 16B are SEM photos of shapes of the fine surface roughness.

FIG. 16A is an SEM photo of the shape of the fine surface roughness that is obtained after having undergone reactive ion etching under the conditions shown in Table 4. The pitch and the depth of the fine surface roughness shown in FIG. 16A are 0.12 micrometers and 0.27 micrometers, respectively.

FIG. 16B is an SEM photo of the shape of the fine surface roughness that is obtained after the fine surface roughness shown in FIG. 16A has further undergone ion beam etching under the conditions shown in Table 6. The pitch and the depth of the fine surface roughness shown in FIG. 16B are 0.12 micrometers and 0.265 micrometers, respectively.

Figure 17:
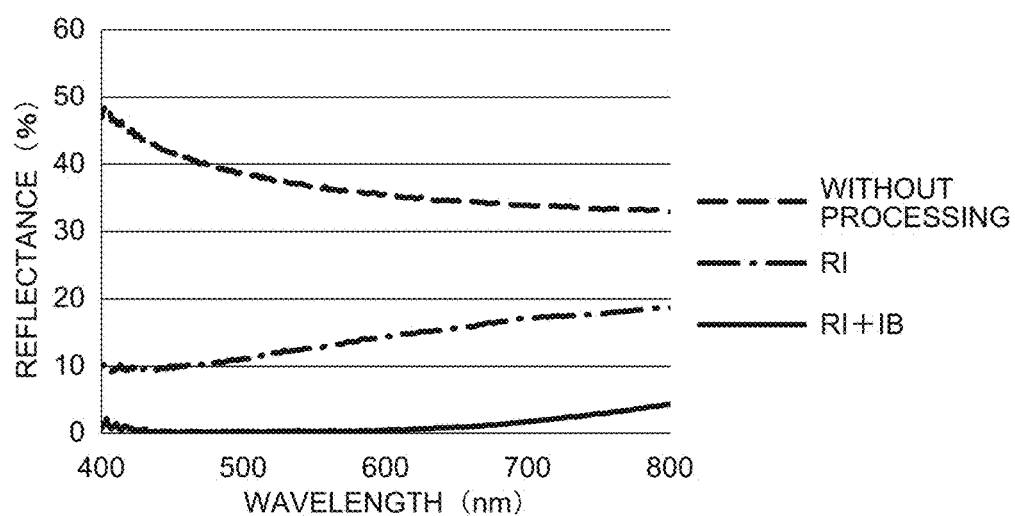
FIG. 17 shows relationships between wavelength and reflectance of molds.

FIG. 17 shows relationships between wavelength and reflectance of molds. The horizontal axis of FIG. 17 indicates wavelength of electromagnetic waves that are made to enter the molds, and the vertical axis of FIG. 17 indicates reflectance for the electromagnetic waves. The electromagnetic waves are made to enter the molds perpendicular to their surfaces. In FIG. 17, a dashed line marked with "without processing" represents reflectance of a mold that is not provided with a fine surface roughness, a dot-and-dash line marked with "RI" represents reflectance of the mold that is shown in FIG. 16A and provided with a fine surface roughness obtained after the mold that is not provided with a fine surface roughness has undergone reactive ion etching, and a solid line marked with "RI+IB" represents reflectance of the mold that is shown in FIG. 16B and provided with a fine surface roughness obtained after the fine surface roughness shown in FIG. 16A has further undergone ion beam etching. For electromagnetic waves in the range from 400 nanometers to 800 nanometers, the reflectance of the mold marked with "without processing" ranges from approximately 33 percent to approximately 49 percent, the reflectance of the mold marked with "RI" ranges from approximately 9 percent to approximately 19 percent and the reflectance of the mold marked with "RI+IB" is 4 percent or less. As described above, a fine surface roughness obtained after a mold has been made to undergo reactive ion etching reduces reflectance, and a fine surface roughness obtained after the fine surface roughness obtained by reactive ion etching has further been made to undergo ion beam etching further reduces reflectance. It is considered that the reason why reflectance is further reduced by making a fine surface roughness obtained by reactive ion etching further undergo ion beam etching is that shapes of protrusions of the fine surface roughness have changed from a cylindrical one to a spindle-shaped (tapered) one. As described above, according to the method of the present invention, shapes of protrusions of a fine surface roughness can be changed to a desirable shape, for example, a spindle-shape by making the fine surface roughness undergo ion beam etching under appropriately determined processing conditions. Accordingly, the method of the present invention is more advantageous than a method in which reactive ion etching alone is carried out.

Figure 18:
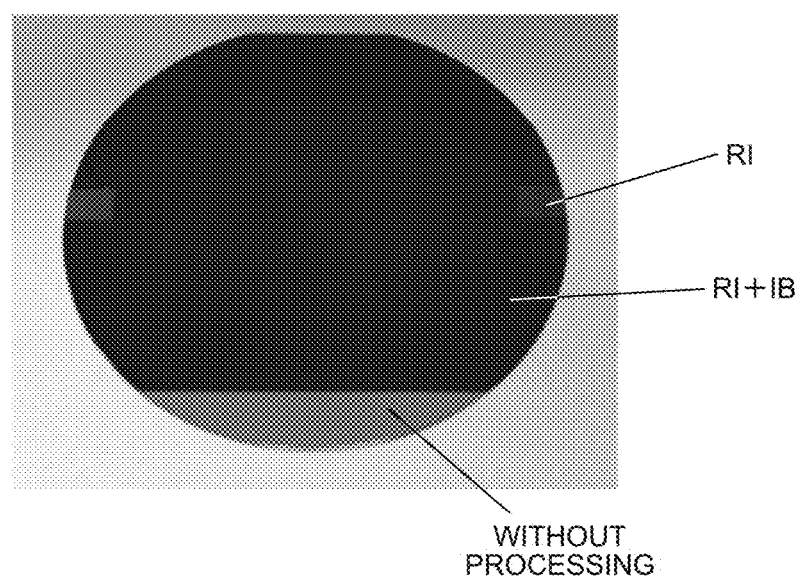
FIG. 18 is a photo showing a mold that is of the type of the mold marked with "without processing", a mold that is of the type of the mold marked with "RI" and a mold that is of the type of the mold marked with "RI+IB"

FIG. 18 is a photo showing a mold that is of the type of the mold marked with "without processing", a mold that is of the type of the mold marked with "RI" and a mold that is of the type of the mold marked with "RI+IB" formed on a single substrate. In the photo of FIG. 18, the portion of the mold that is of the type of the mold marked with "RI+IB" is darkest, and therefore it has been shown that reflectance in the portion is smallest.

Then, a mold is reproduced from the fine surface roughness of the mold shown in FIG. 16B by nickel electroforming, and molded products of polymethylmethacrylate (PMMA) are manufactured by injection molding.

Figure 19:
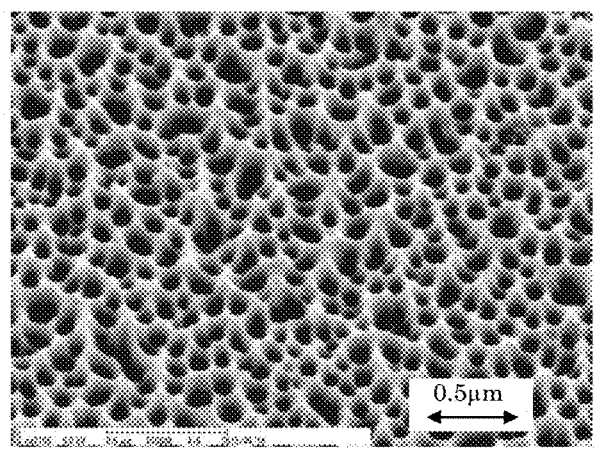
FIG. 19 is an SEM photo showing the fine surface roughness that has been reproduced by nickel electroforming.

FIG. 19 is an SEM photo showing the fine surface roughness that has been reproduced by nickel electroforming.

Figure 20:
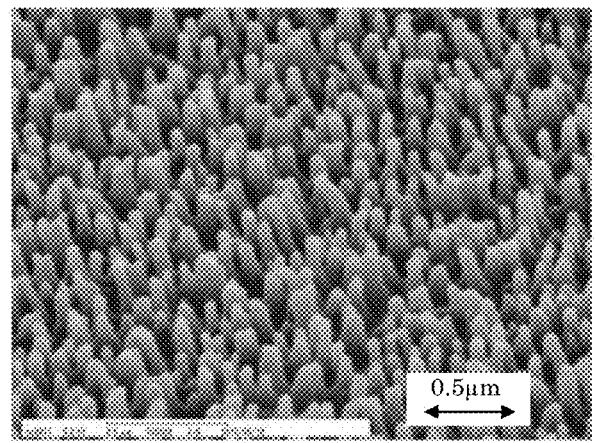
FIG. 20 is an SEM photo showing the fine surface roughness of a molded product manufactured by the mold shown in FIG. 19.

FIG. 20 is an SEM photo showing the fine surface roughness of a molded product manufactured by the mold shown in FIG. 19.

Figure 21:
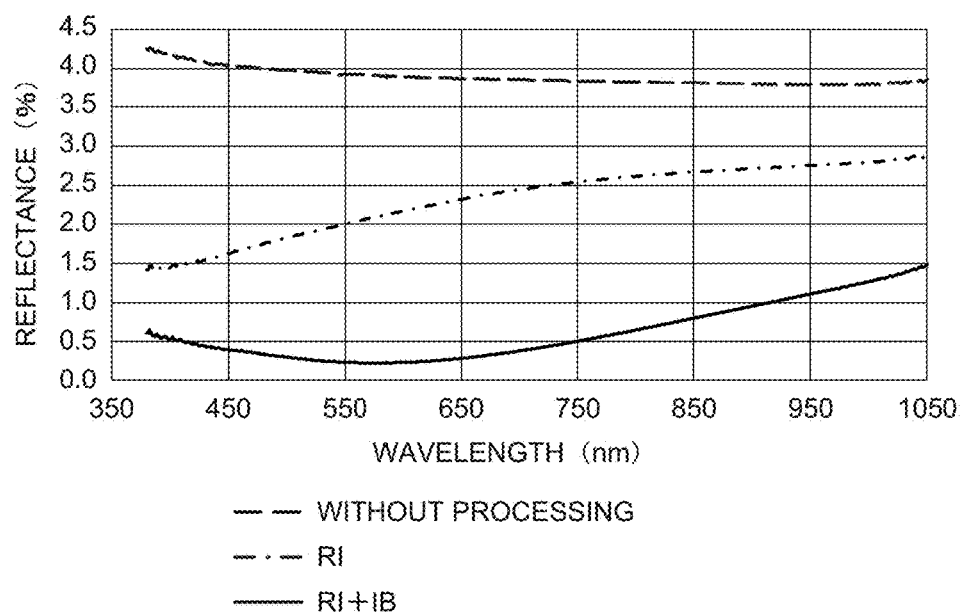
FIG. 21 shows relationships between wavelength and reflectance of molded products.

FIG. 21 shows relationships between wavelength and reflectance of molded products. The horizontal axis indicates wavelength of electromagnetic waves that are made to enter the molded products, and the vertical axis indicates reflectance for the electromagnetic waves. The electromagnetic waves are made to enter the molded products perpendicular to their surfaces. In FIG. 21, a dashed line marked with "without processing" represents reflectance of a molded product that is not provided with a fine surface roughness, a dot-and-dash line marked with "RI" represents reflectance of a molded product manufactured using the mold that is shown in FIG. 16A and provided with a fine surface roughness obtained after the mold that is not provided with a fine surface roughness has been made to undergo reactive ion etching, and a solid line marked with "RI+IB" represents reflectance of a molded product manufactured using the mold that is shown in FIG. 19. For electromagnetic waves in the range from 350 nanometers to 1050 nanometers, the reflectance of the molded product marked with "without processing" ranges from approximately 3.8 percent to approximately 4.3 percent, the reflectance of the molded product marked with "RI" ranges from approximately 1.4 percent to approximately 2.9 percent and the reflectance of the molded product marked with "RI+IB" is 1.5 percent or less. As described above, also in molded products, a fine surface roughness obtained after having been made to undergo reactive ion etching reduces reflectance, and a fine surface roughness obtained after the fine surface roughness obtained by reactive ion etching has further been made to undergo ion beam etching further reduces reflectance.

In the embodiments described above, a mixed gas of sulfur hexafluoride gas and oxygen gas is used in reactive ion etching process. In another embodiment, a fluorine-containing gas such as carbon tetrafluoride gas and trifluoromethane gas can be used instead of sulfur hexafluoride gas.

As described above, molds of the present invention can be used to manufacture anti-reflective optical elements for light in a wide wavelength range including the spectrum the wavelength of which is smaller than that of visible light, the visible light spectrum and the infrared spectrum.

Figure 22:
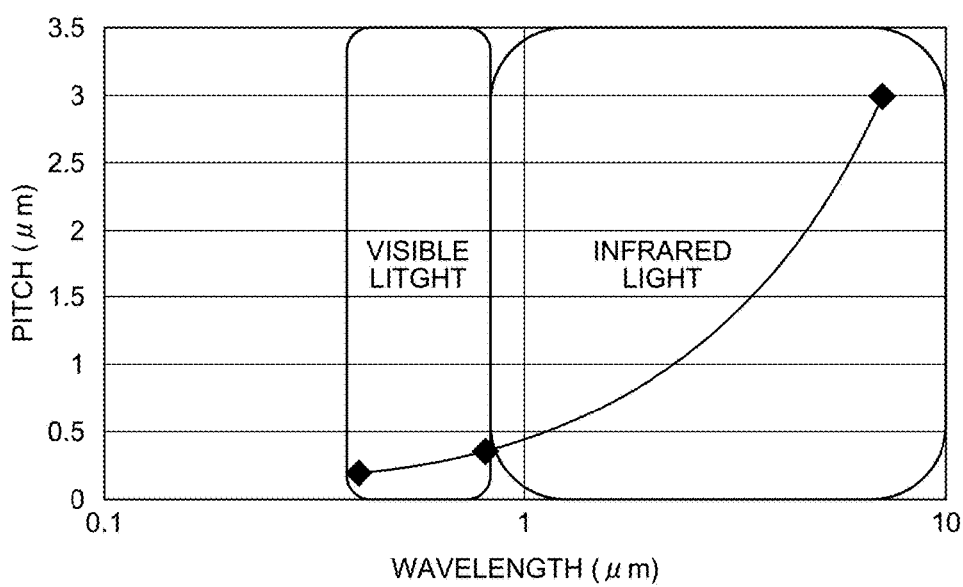
FIG. 22 shows an example of a relationship between wavelength of light reflectance for which is required to be reduced and pitch of a fine surface roughness that functions to reduce the reflectance.

FIG. 22 shows an example of a relationship between wavelength of light reflectance for which is required to be reduced and pitch of a fine surface roughness that functions to reduce the reflectance. The horizontal axis of FIG. 22 indicates wavelength of light reflectance for which is required to be reduced, and the vertical axis of FIG. 22 indicates pitch of the fine surface roughness that functions to reduce the reflectance.

The pitch of the fine surface roughness manufactured under the processing conditions shown in Table 3, for example, is much greater than the wavelengths of visible light. On the other hand, distances in the direction parallel to the base material surface between adjacent protrusions or adjacent recessed portions are not fixed and distributed in a certain range. Accordingly, diffracted lights of various orders and of various values of wavelength are generated by the fine surface roughness. In other words, the substrate provided with the fine surface roughness diffuses visible light. Thus, molds according to the present invention can be used to manufacture an optical element for diffusion.

Further, molds according to the present invention can be used for frosting on the same principle as that of anti-reflection.

Further, pitch of a fine surface roughness formed by a mold according to the present invention is not fixed, and therefore reflected and diffracted waves do not generate constructive interference. Accordingly, a fine surface roughness formed by molds according to the present invention can be used to reduce reflection and to generate "a soft hue".

Further, a fine surface roughness formed by molds according to the present invention can be used to form an adhesive surface. Specifically, when a fine surface roughness with spindle-shaped protrusions is formed, an adhesive agent more easily adhere to the surface, and thereby adhesiveness of the surface improves.

Further, an optical element used for an infrared range can be manufactured by forming a fine surface roughness on a curved surface of silicon, which has been obtained by machining or the like, through reactive ion etching and ion beam etching performed in the steps shown in FIG. 1 and FIG. 4.

What is claimed is:

1. A method for manufacturing a mold, including the steps of:
    placing a base material of semiconductor or metal that reacts with sulfur hexafluoride in a reactive ion etching apparatus;
    supplying a mixed gas of sulfur hexafluoride and oxygen thereto;
    making the base material undergo a plasma dry-etching process such that oxides are scattered on a surface of the base material, etching advances on the surface of the base material while the oxides function as etching masks, and thereby a fine surface roughness is formed on the surface of the base material; and
    irradiating the fine surface roughness of the base material with an accelerated ion beam in an ion beam etching apparatus such that shapes of protrusions of the fine surface roughness can be adjusted.

2. A method for manufacturing a mold according to claim 1, further including the step of reproducing the fine surface roughness by electromolding.

3. A method for manufacturing a mold according to claim 1, wherein before the fine surface roughness of the base material is irradiated with the ion beam, the base material is fixed onto a surface of a stage that can rotate around an axis in the ion beam etching apparatus, the axis being tilted to the direction of the ion beam at a nonzero angle that is up to 20 degrees.

4. A method for manufacturing a mold according to claim 1, wherein the base material is formed as a plate substrate or a film.

5. A method for manufacturing a mold according to claim 1, wherein a mixed gas of carbon tetrafluoride or trifluoromethane and oxygen is used in place of the mixed gas of sulfur hexafluoride and oxygen.

6. A method for manufacturing molded products, including the steps of:
    manufacturing a mold according to the method recited in claim 1; and
    manufacturing molded products through molding with the mold.

* * * * *